United States Patent
Moshrefzadeh et al.

(10) Patent No.: US 6,198,051 B1
(45) Date of Patent: Mar. 6, 2001

(54) DISPLAY SUBSTRATE ELECTRODES WITH AUXILIARY METAL LAYERS FOR ENHANCED CONDUCTIVITY

(75) Inventors: Robert S. Moshrefzadeh, Oakdale; Raghunath Padiyath, Woodbury, both of MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/425,098

(22) Filed: Oct. 22, 1999

Related U.S. Application Data

(62) Division of application No. 09/076,165, filed on May 12, 1998, now Pat. No. 6,037,005.

(51) Int. Cl.$^7$ ................................... H05K 1/03
(52) U.S. Cl. .................. 174/255; 174/261; 428/1.62
(58) Field of Search ................... 174/255, 256, 174/258, 260, 261; 361/760, 767, 768, 771; 428/1.1, 1.61, 1.62

(56) References Cited

U.S. PATENT DOCUMENTS

| | | | |
|---|---|---|---|
| 5,426,266 | * 6/1995 | Brown et al. | 174/267 |
| 5,434,363 | * 7/1995 | Goto et al. | 174/256 |
| 5,500,787 | * 3/1996 | Yoshida | 361/779 |
| 5,805,419 | * 9/1998 | Hundt | 361/719 |

* cited by examiner

*Primary Examiner*—Hyung-Sub Sough
*Assistant Examiner*—Jeremy Norris
(74) *Attorney, Agent, or Firm*—Robert J. Pechman

(57) ABSTRACT

Disclosed is a transparent substrate element for electronic displays that includes a transparent base layer, a plurality of independently addressable transparent electrodes disposed on the base layer, and a contiguous metallic coating associated with each transparent conductive electrode to increase the conductivity of the associated transparent conductive electrode, wherein the contiguous metallic coating comprises a periodic array of holes arranged to allow a significant amount of visible light to be transmitted through the substrate element.

5 Claims, 5 Drawing Sheets

DISPLAY SUBSTRATE ELECTRODES WITH AUXILIARY METAL LAYERS FOR ENHANCED CONDUCTIVITY

This is a divisional of application Ser. No. 09/076,165 filed May 12, 1998 now U.S. Pat. No. 6,037,005.

FIELD OF THE INVENTION

This invention relates to display substrates having transparent conductive electrodes with auxiliary metal layers to increase their conductivity and to a method of providing these auxiliary metal layers without high precision alignment steps.

BACKGROUND OF THE INVENTION

Transparent conductive oxide (TCO) films are used in many display device applications where electric fields must be applied to activate picture elements (pixels) and where optical transparency is essential. For example, liquid crystal display substrates often employ parallel strips of TCO material as electrodes. When a pair of such substrates are combined in a display with their opposing TCO electrode strips oriented to form a matrix, the area of the display through which any pair of TCO strips cross defines a pixel. By applying an electric field between a pair of crossed TCO strips, the liquid crystal disposed therebetween may be reoriented. This reorientation affects how light is transmitted through these activated areas. For example, polarized light traveling through a liquid crystal display will be transmitted through activated pixel areas with a polarization perpendicular to that transmitted outside of the activated pixel areas. Polarizers may then be employed so that the display appears dark in the activated pixel areas while light is transmitted through the display elsewhere.

The speed at which pixels can be activated and deactivated depends critically on the conductivity of the TCO electrodes. A shorter "refresh rate," corresponding to the speed at which pixels can be turned on and off, may be required in many applications including those employing large or high resolution displays. Shorter refresh rates may be realized by increasing the conductivity of the TCO electrodes, especially in displays having a high pixel density. Increasing the conductivity of TCO electrodes also enhances the display appearance by improving uniformity.

One way in which to increase the conductivity of a TCO layer is to anneal it at high temperatures (above about 250° C.). When glass is used as the substrate material, this method is viable. However, in many applications such as large area liquid crystal displays, glass substrates are too heavy, and so polymeric substrates are preferred. Polymer materials suitable as substrate materials in liquid crystal displays often have glass transition temperatures and melting temperatures well below the high temperatures required for annealing to increase the conductivity of TCO layers. As such, high temperature annealing is not an available option when attempting to increase the conductivity of the TCO electrodes when polymeric substrates are employed.

Another means of increasing the conductivity of a TCO layer is to provide an auxiliary metal layer in contact with the TCO layer. Typically, the metal layer takes the form of a narrow strip, or line, of metallic material deposited on a TCO electrode. Addition of a metal strip increases the conductivity of a TCO electrode by decreasing the resistivity according to the following relationship:

$$R_T \propto \frac{R_{TCO} \times R_M}{R_{TCO} + R_M},$$

where $R_T$ is the resistivity of the electrode as a whole, $R_{TCO}$ is the resistivity of the TCO layer, and $R_M$ is the resistivity of the metal strip. When $R_M$ is much less than $R_{TCO}$, which is typically the case, $R_T$ approaches $R_M$, thus resulting in an electrode having a resistivity much lower than that of a bare TCO electrode. The increase in conductivity results as long as the metal layer is continuous along the length of the electrode. This is significant because high density displays having small pixels and thereby small electrodes require small auxiliary metal layers that may be amenable to cracks or fractures that disrupt electrical conductivity.

Because transparency of the final device is often essential, and because metal layers thick enough to enhance the TCO electrode conductivity are generally optically opaque, it is important that the metal strip does not substantially cover the TCO electrode. Moreover, when independently addressable TCO electrode strips are arranged in close proximity on a substrate, alignment of each metal strip with each TCO strip is essential. Without alignment, the metal strips may cross over to adjacent TCO electrodes, thereby causing an electrical short across adjacent electrodes. Alignment is especially critical on large area and high resolution displays, where the electrode strips may be longer or closer together, thus leaving less room for error.

Typically, one of three methods (or a variation thereof) are used to fabricate TCO electrodes having auxiliary metal strips. First, thin metal strips may be directly deposited through a mask onto preexisting TCO electrode strips. This requires precision alignment of the deposition mask with the patterned electrodes. Second, metal strips may be deposited on substrate having a TCO layer that has not yet been patterned into electrodes. Portions of the TCO layer and any unwanted metal are then removed to form TCO electrodes with auxiliary metal strips. This requires precision alignment of an etch mask or a laser scribe with the patterned metal strips. Lastly, metal strips may be deposited directly onto a substrate followed by deposition of TCO strips directly on top of the metal strips. Again, this requires precision alignment of a deposition mask with the patterned metal strips. In each of these methods, the required precision alignment step reduces the efficiency of the process and risks introduction of defects.

A method for providing auxiliary metal strips to TCO electrodes without a precision alignment step is described in U.S. Pat. No. 5,342,477 to Cathey. This method involves providing a substrate having a plurality of transparent electrodes, each electrode comprising a strip of transparent silicon dioxide stacked on a strip of transparent conductive material. The entire surface is then coated with a highly conductive material. The highly conductive material is then vertically etched until the material on top of the electrodes is removed and an area between the electrodes is exposed. What remains is a "runner" of conductive material along each side of the transparent electrode stack.

While the method disclosed by Cathey does not require a high precision alignment step, it has major deficiencies affecting its viability. First, the method relies on relatively thick electrode stacks so that conductive material will accumulate at the edges of the electrodes during deposition and remain there after the etching step. While the stack is substantially transparent, it is well known that increasing the electrode thickness will decrease the brightness of the display. Second, the conductive "runners" contact only the sides of the transparent conductive portions of the electrode. Because the transparent conductive portions must be thin, the total area of surface contact between the conductive runners and the transparent conductive strips is quite small. Thus, delamination of the conductive runners from the transparent conductive strips is likely. When delamination occurs, the conductive runners have no effect.

Another method for providing auxiliary metal strips to the edges of TCO electrodes without a precision alignment step is discussed in Japanese Kokai Patent Application No. 4-360124. In the method there disclosed, TCO electrodes are formed on a substrate by conventional photolithography. The photoresist is left on the TCO material, and a metal is electroplated onto the exposed side edges of the electrodes. The photoresist is then removed to leave a series of TCO electrodes having metal strips along their edges. While this method addresses some of the deficiencies of the Cathey method, the reliance on metal plating techniques risks excessive metal build-up between electrodes that would short-out adjacent electrodes in the display. This risk is especially apparent for high density displays where the distance between electrodes may be quite small.

SUMMARY OF THE INVENTION

The present invention addresses these shortcomings by providing a method of patterning auxiliary metal layers to increase the conductivity of independently addressable TCO electrodes without the need for precision alignment in relation to pre-patterned electrodes.

In one embodiment, the method of the present invention first involves providing a substantially transparent substrate having a transparent conductive layer thereon. Next, parallel strips of resist material are formed on the transparent conductive layer, thereby leaving areas of the transparent conductive layer uncovered by the resist material. A collimated metal beam is then used to deposit a metal coating on the transparent conductive layer and strips of resist, whereby the collimated beam is incident at such an angle as to be partially blocked by the parallel strips of resist material. This leaves portions of the uncovered transparent conductive layer exposed. The exposed portions of the transparent conductive layer are then removed. Finally, the strips of resist material are removed, along with any metal coating thereon, to form a plurality of independently addressable electrodes on the substrate, each having an auxiliary metal strip.

In another embodiment, the method of the present invention first involves providing a substantially transparent substrate. Next, parallel strips of resist material are formed on the transparent substrate. A metal is then deposited on the substrate and resist strips, making sure that metal material is deposited at the sides of the resist strips. The metal coating is then etched to remove it from the tops of the resist strips and from the area of the substrate between the resist strips, but not from the sides of the resist strips. The metal coating that remains forms continuous metal lines along the edges of the resist strips. Next, a transparent conductive film is deposited to substantially cover the resist strips, metal lines, and exposed substrate. Finally, the resist strips are removed. This leaves parallel strips of the transparent conductive film on the substrate, each of the parallel strips of transparent conductive film having its sides bordered by the continuous metal lines. Each parallel strip of transparent conductive film bordered by the metal lines represents an independently addressable electrode on the surface of the substrate, each of the electrodes separated by a distance that corresponds to the width of the initially formed resist strips.

In still another embodiment, the method of the present invention involves providing a substantially transparent substrate having a transparent conductive layer thereon. A contiguous metallic coating is formed adjacent to the transparent conductive layer, either on the surface opposing the substrate or between the transparent conductive layer and the substrate. The contiguous metallic coating is characterized by a periodic array of holes, such as a hexagonal array of circular holes or a regular array of diamond-shaped holes. The holes ensure that the substrate element remains substantially transparent. Independently addressable transparent electrodes are then formed by removing portions of the transparent conductive layer and any metallic coating adjacent to those portions.

The present invention also includes a substrate element suitable for use in an electronic display device. The substrate element includes a substantially transparent substrate and a plurality of independently addressable electrodes. The electrodes are made up of a layer of a transparent conductive material and a contiguous metallic coating having a periodic array of holes.

It is the purpose of the present invention to provide a method of increasing the conductivity of TCO electrodes by providing auxiliary metal layers adjacent to the TCO electrodes without the need for precision alignment of the metal layers prior to their formation. It is further the purpose of the present invention to provide a method of increasing the conductivity of TCO electrodes on liquid crystal display substrates by providing auxiliary metal layers adjacent to the TCO electrodes. It is further the purpose of the present invention to provide a display substrate element having independently addressable transparent electrodes comprising a transparent conductive layer and a patterned metal layer.

DETAILED DESCRIPTION

The present invention involves a method for providing transparent conductive electrodes with auxiliary metal layers to enhance the conductivity of the electrodes without significantly altering their transparent properties. The metal layers are provided without the use of a high precision alignment step such as alignment of a deposition or etch mask with a pre-patterned electrode structure. While the metal layers provided in the present invention may be any conductive metallic material suitable for the particular application, the metal layers are preferably include materials capable of being deposited onto a substrate via known techniques such as evaporation or sputtering. Examples of such materials include, but are not limited to, Cr, Cu, Ag, Au, Ni, W, Al, Pt, Ti, Fe, Sn, or combinations or alloys thereof.

While the various aspects of the present invention are best understood in light specific embodiments, the embodiments described hereinafter and the examples contained therein are in no way meant to limit the scope of the present invention or its recited claims.

A. First Embodiment

One embodiment of the method of the present invention is shown in FIGS. 1(a)–(e). First, a substrate element is provided having a substrate 20 with a transparent conductive layer 22. The substrate 20 is a substantially transparent material suitable for use in electronic display devices. Preferred substrates include glass and any suitable transparent polymeric material. The transparent conductive layer 22 is preferably a transparent conductive oxide (TCO) material, and the TCO material is preferably indium tin oxide (ITO).

Figure 1A:
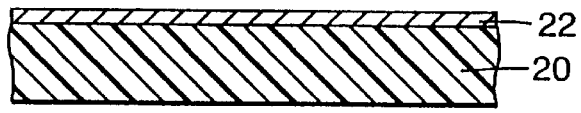
FIGS. 1(a)–(e) are schematic representations of the steps involved in a particular embodiment of the method of the present invention.
Figure 1B:
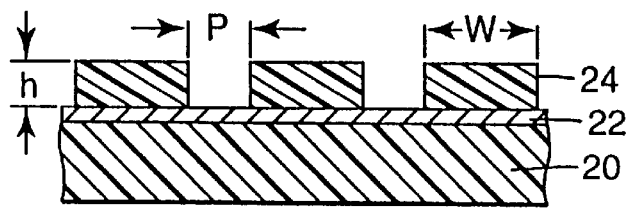

Next, strips 24 of resist material are provided as shown in FIG. 1(b). The width w of the resist strips 24 corresponds to the width of a pixel in a finished display. The resist strips 24 are provided by coating the surface with a resist material and drying it to form a coating having a thickness h. The resist coating may then be exposed to light of a certain wavelength to activate the photo-initiators in the resist. The resist coating is exposed to the light through a mask so that only certain areas are activated. Depending on whether the resist is a positive resist or a negative resist, the activated or non-activated areas may be removed by rinsing in a solution. The resulting resist coating is a plurality of resist strips separated by a distance P that corresponds to the inactive area between pixels in the completed display substrate. The resist material may be any resist material desired that does not adversely react with the electrode material. There are many commercially available formulations of resist materials, and the procedure for their coating, drying, activation, and removal will be known to the user when a particular resist material is chosen.

Figure 1C:
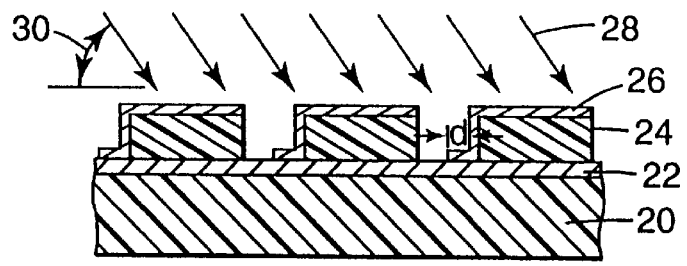

A metal coating 26 is then deposited over the substrate as shown in FIG. 1(c). In order to form narrow metal strips at the TCO surface, a technique called "shadow coating" is employed. In shadow coating, a collimated beam 28 of the material to be deposited is formed, usually in a vacuum chamber using known deposition techniques. The collimated beam 28 is then directed at a certain angle of incidence 30 relative to the plane of the substrate element. The resist strips 24 function to block a portion of the collimated beam so that only a strip of width d is formed in the area between the resist strips. The width d of the metal coating on the TCO surface is given by:

$$\tan\theta = \frac{h}{P-d},$$

where θ is the angle 30 of the collimated beam measured in reference to the plane of the substrate element. The step of shadow coating leaves an area of the TCO layer exposed having a width of P-d as shown in FIG. 1(c).

Figure 1D:
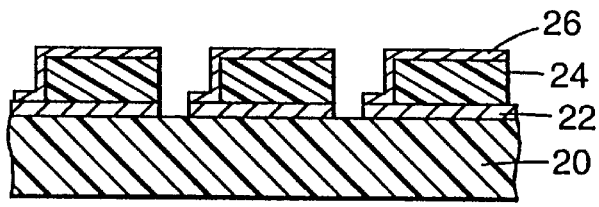
Figure 1E:
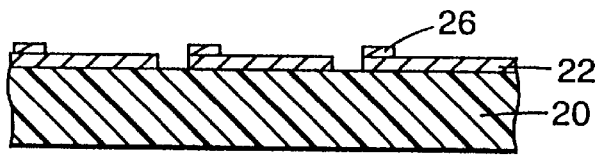

The exposed portions of the TCO layer 22 are then etched, using the metal coating as an etch barrier. The result is shown in FIG. 1(d);

The resist strips 24 are then removed by lift-off, along with any metal coating 26 residing on the resist. The resulting substrate element, shown in FIG. 1(e), includes a substrate 20 having a plurality of independently addressable electrodes, each electrode having a TCO layer 22 and an auxiliary metal layer 26. The auxiliary metal layers increase the conductivity of the TCO electrodes. In addition, the auxiliary metal layers are often thick enough to be opaque and thus function as a dark matrix.

Dark matrix is opaque material on a display substrate that blocks light from being transmitted through the inactive areas of the display. This increases the contrast of the display. When two or more adjacent pixels are activated, thus appearing dark, the absence of a dark matrix allows light to be transmitted through the inactive areas between the activated pixels. This makes the activated pixels appear gray rather than black, thus reducing contrast. The presence of a dark matrix alleviates this concern.

Dark matrix may be applied during the process shown in FIG. 1. After the step of removing the exposed TCO layer (shown in FIG. 1(d)), a non-conductive opaque material may be deposited over the surface. Thus, when the resist strips are removed, the resulting substrate element will be as shown in FIG. 1(e) with the addition of an opaque layer between the electrodes that serves as a dark matrix. It is important that the opaque material be non-conductive so that adjacent electrodes remain electrically independent.

EXAMPLE A1

A polymethylpentene substrate, available under the trade designation Zeonex sold by Nippon Zeon Co., Ltd., Tokyo, Japan, was coated with an ITO layer having a thickness of 80 nm (0.08 $\mu$m). The surface of the ITO layer was then spin coated at 1500 revolutions per minute (rpm) for 60 seconds with a photoresist sold by Shipley Co., Marlborough, Mass. under the trade designation Shipley Resist 827. The coating was then dried at 105° C. for 30 minutes. The photoresist was then exposed to ultraviolet radiation at a wavelength of 365 nm and intensity of 9.8 mW/cm$^2$ for 30 seconds through a mask having 75 $\mu$m wide parallel line apertures. The photoresist was then immersed for 70 seconds in a developing agent sold by Shipley Co. under the trade designation Shipley Developer 354. The sample was then rinsed and dried. At this point, the sample was analogous to that shown in FIG. 1(b). The surface was then shadow coated using a collimated beam of Cr metal at an angle of incidence of 7°. The Cr coating was 200 nm (0.2 $\mu$m) thick. The sample was then immersed in a 10% HCl solution for 70 seconds to remove the exposed ITO layer. The excess resist was removed by subsequent immersion in an acetone ultrasonic bath. The resulting substrate element was analogous to that shown in FIG. 1(e).

B. Second Embodiment

Figure 2A:
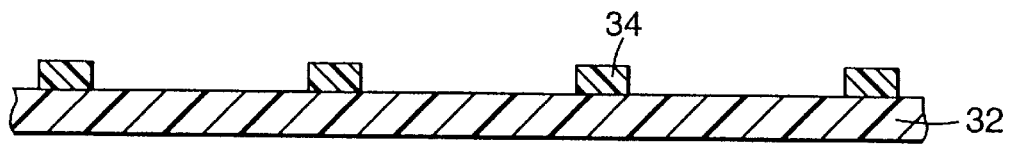
FIGS. 2(a)–(g) are schematic representations of the steps involved in another embodiment of the method of the present invention.

Another embodiment of the method of the present invention is shown in FIGS. 2(a)–(g). First, a substantially transparent display substrate 32 is provided as shown in FIG. 2(a). Substrate 32 may be of any material suitable for use in an electronic display substrate element as discussed previously.

Strips 34 of a resist material are formed on the substrate as shown in FIG. 2(a). The strips are formed by conventional lithography techniques. Typically, the entire substrate is covered with the resist material by lamination or by coating the material in a liquid form. The resist material is patterned by selective exposure to light at a given wavelength and intensity, followed by removal of the activated material as discussed above in part A. The resist strips 34 of FIG. 2(a) may be compared to the resist strips 24 of FIG. 1(b). Whereas in FIG. 1(b) the width of the resist strips was chosen to correspond to the desired width of the electrodes on the finished display substrate element, conversely the width of resist strips 34 in FIG. 2(a) correspond to the desired width of the gap between electrodes on the finished display substrate element.

Figure 2B:
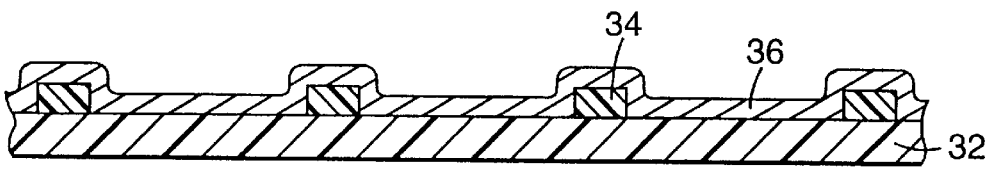

Next, a metal 36 is deposited over the substrate and resist strips as shown in FIG. 2(b). The metal may be deposited by any suitable technique such as vapor deposition, sputter deposition, chemical plating, electroplating, or other methods known in the art. The metal is preferably coated to substantially cover the surface of the substrate and the resist strips.

Figure 2C:
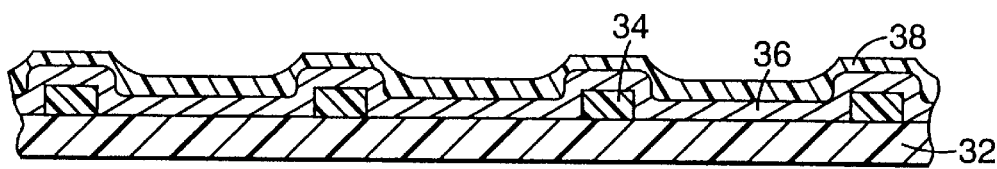
Figure 2D:
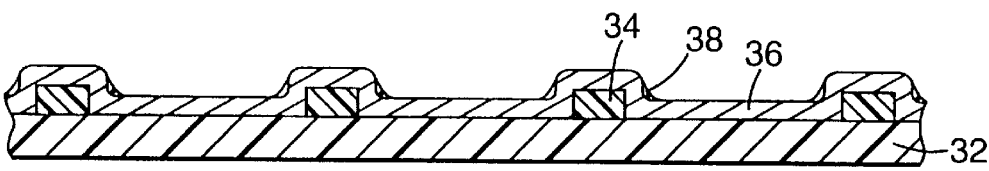

Next, a second resist material 38 is coated over the metal coating as shown in FIG. 2(c). Preferably, the second resist is coated as a liquid so that a meniscus forms on the metal coating in the corner area formed by resist strips 34. For example, a suitable liquid resist material may be the one sold by Shipley Co.,. Marlborough, Mass. under the trade designation Shipley 1818. The meniscus of the liquid resist material ensures that additional resist material is built up in the corners on the metal coating. Thus, when the second resist material is etched back to expose the metal coating on top of the resist strips and between the resist strips, excess second resist material 38 remains at the corners on the metal coating as shown in FIG. 2(d). The etch back of the second resist material is preferably performed using conventional reactive ion etching or plasma etching techniques.

Figure 2E:
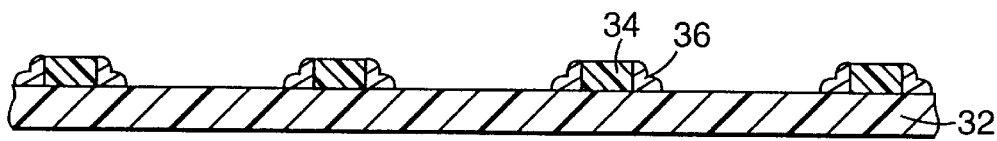

Next, the metal coating is etched with the remaining second resist material acting as an etch barrier. Etching removes the entire metal coating except those portions covered by the remaining second resist material. This leaves a continuous strip, or line, of metal coating disposed along each edge of the resist strips. The remaining second resist material is then stripped from the substrate element to leave substrate 32, resist strips 34, and remaining strips of metal 36 adjacent to the edges of the resist strips as shown in FIG. 2(e).

Figure 2F:
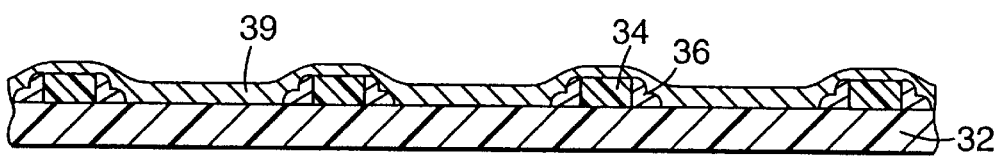

Next, a transparent conductive material 39 is deposited over the substrate element to substantially cover the exposed areas of the substrate as shown in FIG. 2(f).

Figure 2G:
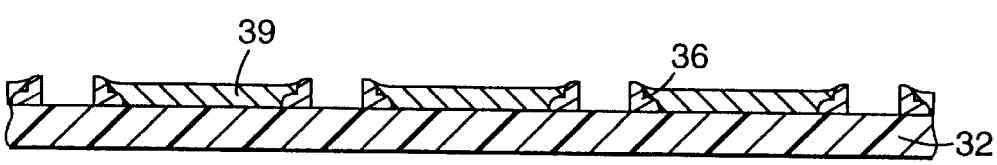

Finally, resist strips 34 are removed from substrate 32, along with any residual transparent conductive material residing thereon, to leave substrate 32 having independently addressable electrodes made up of parallel strips of transparent conductive material 39, each strip having auxiliary metal strips 36 disposed along its edges as shown in FIG. 2(g).

The embodiment of the method of the present invention described in this part and shown in FIGS. 2(a)–(g) provides distinct advantages. First, because two auxiliary metal strips are formed for each electrode, the electrodes have a higher conductivity than for one auxiliary metal strip, thus allowing for a thinner transparent conductive layer in the electrode, and hence improving transmission through the substrate element. In addition, the resistivity of the electrodes is tunable by controlling the amount of etch back of the second resist material—more etch back means more metal coating exposed which means more metal coating is removed upon etching, resulting in higher resistivity auxiliary metal strips. Second, the auxiliary metal strips are formed off of pre-patterned resist strips and not off of pre-patterned transparent conductive electrodes. This allows the metal strips to be patterned independently from the transparent conductive electrode material, therefore allowing fabrication of thinner electrodes. Third, because the final step of this embodiment of the method of the present invention is a removal step rather than a metal addition step, there is no risk of adding excess metal that may short out adjacent electrodes.

EXAMPLE B1

This example describes the process shown in FIGS. 2(a)–(g) on a microreplicated substrate where the resist strips 34 are parallel ridges that are integral with the substrate. The use of microreplicated plastic substrates in liquid crystal display devices is explained in U.S. Pat. No. 5,268,782 to Wenz. Briefly, a liquid crystal display substrate may be imparted with a series of microreplicated parallel ridges, each ridge rising to the same height in a range of approximately 1 $\mu$m to 20 $\mu$m from the surface of the substrate depending on, for example, the type of liquid crystal used. As explained in co-pending U.S. patent application U.S. Ser. No. 08/999,287, U.S. Pat. No. 6,077,560 these ridges may be used to further pattern the substrate without the used of further mask alignment steps.

A sample of a microreplicated plastic liquid crystal display substrate was coated with an approximately 2000 Å(0.2 $\mu$m) thick copper film via sputter deposition. Next, a thin photoresist layer was coated over the copper using the 180R knurl roll on a Yasui-Seiki microgravure coater CAG-150. The photoresist solution was prepared by diluting Shipley 1818 resist in methyl ethyl ketone to obtain a 20% solids solution. The photoresist coating was dried at 100° C. in an air impingement oven. After drying, a photoresist coating approximately 1 to 1.5 $\mu$m thick was obtained. However, the coating thickness along the edges of the substrate ridges was much higher due to surface tension effects during application. The photoresist coating was then etched in an RF oxygen plasma to remove the resist coating from the center of the channels. The etching time was adjusted such that photoresist remained along the edges of the ridges after etching. The oxygen plasma was generated at 100 mTorr pressure, 100 sccm flow rate, and 120 Watts of RF power. The etching time under such conditions was 3 minutes. Following the etching of the photoresist, the exposed copper was etched with a 10% $H_2SO_4$ solution at about 50° C. for 2 minutes in a spray system. Next, the remaining resist was stripped using a 4% NaOH solution at about 45° C. also by spraying. The resulting substrate had copper lines along the ridge edges in a manner analogous to FIG. 2(e). Next, the sample was coated with ITO followed by a coating of Shipley 1818 photoresist using the Yasui-Seiki coater to obtain a resist thickness of approximately 2.5 to 3.0 $\mu$m in the channels. The sample was then etched in an oxygen plasma under the conditions described above for 2 minutes. This resulted in the removal of the resist from only the tops of the ridges, leaving resist material in the channels between ridges to protect the ITO. The exposed ITO on the tops of the ridges was then etched with a 10% $H_2SO_4$ solution at about 45° C. for 1 minute. Finally, the remaining resist was stripped using a 4% NaOH solution at about 50° C. The sample produced was much like that shown in FIG. 2(g), except that the microreplicated parallel ridges existed where gaps are shown in FIG. 2(g) between the ITO strips.

EXAMPLE B2

This example describes the fabrication of copper bus lines on flat substrates. The process steps for the fabrication of bus lines on flat substrates are very similar to those in Example B1 for microreplicated ribbed substrates. First, a negative photoresist (Hercules SF 206) was laminated to a 100 $\mu$m PET film and patterned into lines using standard lithography processes. The result was as shown in FIG. 2(a). After patterning the photoresist, the substrate was coated with copper as in FIG. 2(b). Next,.Shipley 1818 photoresist was coated on the substrate using the Yasui-Seikin microgravure coater to obtain a sample as shown in FIG. 2(c). The Shipley resist was then plasma etched to remove the resist from the substrate except at the edge of the strips of the Hercules resist, as shown in FIG. 2(d). The exposed copper layer was then etched in a 10% $H_2SO_4$ solution at about 50° C. for 2 minutes. The Shipley resist was subsequently removed in an oxygen plasma to obtain a sample as shown in FIG. 2(e). The substrate containing copper lines was then coated with ITO as in FIG. 2(f). Stripping of the Hercules resist in a 4% NaOH solution at about 45° C. for 2 minutes resulted in patterned ITO lines on the substrate, as in FIG. 2(g).

C. Third Embodiment

Still another embodiment of the present invention is shown in FIGS. 3(a)–(f). First a substrate element is provided comprising a substantially transparent substrate 40, a TCO layer 42, and a contiguous metal layer 44 having a periodic array of holes. Although the metal layer in FIGS. 3(a)–(f) is positioned on top of the TCO layer, the metallic layer could also be disposed between the substrate and the TCO layer. For each step in the process shown in FIGS. 3(a)–(f), a top view and a cross-sectional view are shown. The cross-sectional views are taken along their respective lines 3b, 3d, and 3f.

Figure 3A:
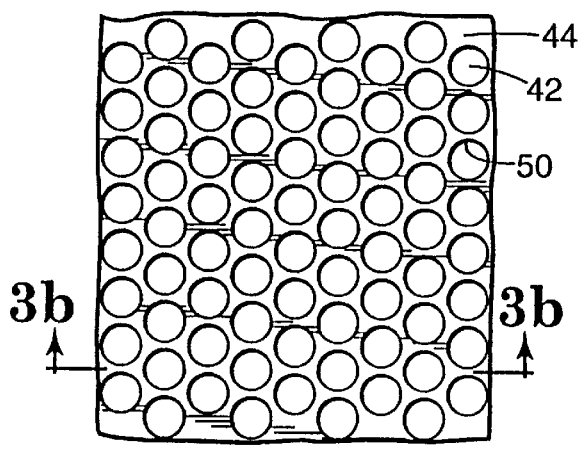
FIGS. 3(a)–(f) are schematic top and side views representing the steps involved in a particular embodiment of the method of the present invention.
Figure 3B:
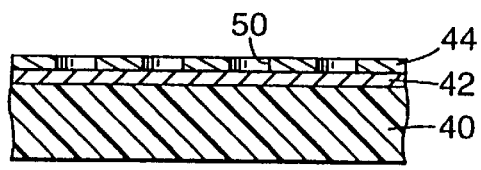

As seen in the top view of FIGS. 3(a) and (b), the metal layer 44 is characterized by a periodic array of holes 50. The metal layer is formed by depositing a uniform metal layer by known techniques such as vapor deposition or sputtering. A resist material is then coated on the metal layer and exposed to light through a mask having the desired pattern. The activated resist is then washed away so that the remaining photoresist coating forms an array of holes that expose the underlying metal layer. The exposed metal is then etched and the photoresist is removed. The resulting metal layer is a contiguous layer having a periodic array of holes. Because the independently addressable transparent conductive electrodes have not yet been formed at this stage, there is no need to align the photoresist mask in any particular orientation.

The shape of the individual holes and their arrangement in a periodic array may take many forms, as discussed below. The shape of the holes and the arrangement of the array will affect both the conductivity of the metal layer and the transparency of the substrate element. For simplicity, a metal layer having a hexagonal array of circular holes is shown in FIGS. 3(a)–(f).

Figure 3C:
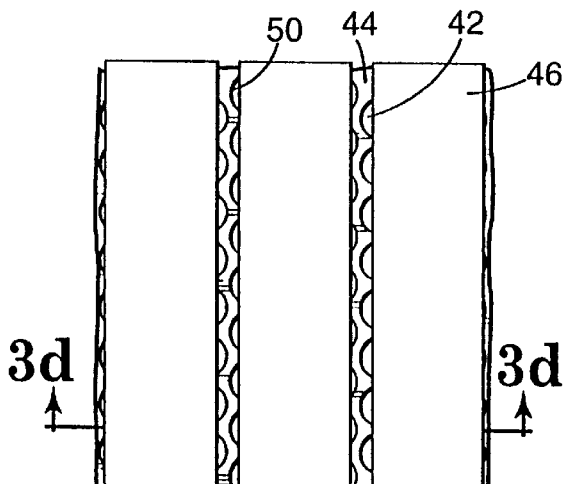
Figure 3D:
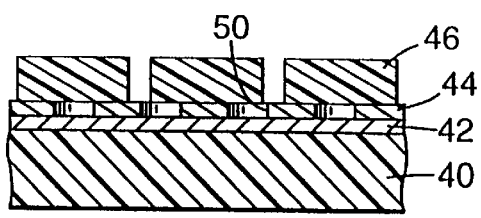
Figure 3E:
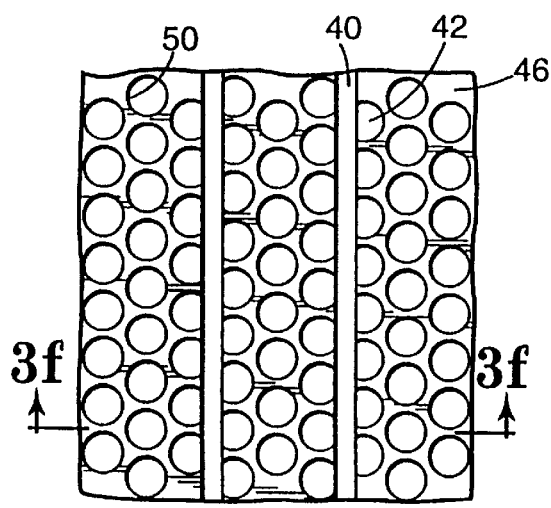
Figure 3F:
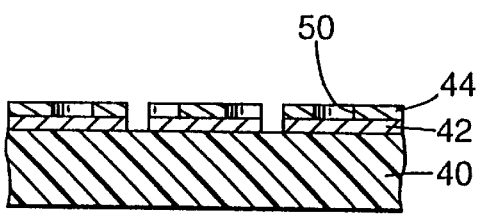

Next, strips 46 of resist material are provided as shown in FIGS. 3(c) and (d). The width of the resist strips 46 corresponds to the width of a pixel in a finished display. The resist strips 46 are provided by coating the surface with a resist material and drying it to form a coating. The resist coating may then be exposed to light of a certain wavelength to activate the photo-initiators in the resist. The resist coating is exposed to the light through a mask so that only certain areas are activated. Depending on whether the resist is a positive resist or a negative resist, the activated or non-activated areas may be removed by rinsing in a solution. The resulting resist coating is a plurality of resist strips separated by a distance corresponding to the inactive area of the display between pixels. This result is shown in FIGS. 3(c) and (d). The resist material may be any resist material desired that is compatible with the electrode material. There are many commercially available formulations of resist materials, and the procedure for their coating, drying, activation, and removal will be known to the user when a particular resist material is chosen.

Next, the areas of the metal and TCO layers not covered by the resist strips are removed by etching. The resist coating may then be removed to produce the substrate element shown in FIGS. 3(e) and (f). As may there be seen, the substrate element comprises a substantially transparent substrate 40, and independently addressable electrodes each having a TCO layer 42 and a contiguous metal layer 44 characterized by a periodic array of holes 50.

The contiguous metal layers of the independently addressable electrodes serve multiple functions. First, the metal layers increase the conductivity of the electrodes relative to bare TCO electrodes. Second, the periodic array of holes allows electrical continuity in the metal layer while minimally affecting the transparency of the substrate element. Third, because a metal layer covers the entire width of an electrodes, there is no need for a precision-alignment step. Rather, the metal and TCO layers are removed together using the same etch mask so that a separate mask for the metal layer that would require a precision alignment step need not be used. Finally, the structure of the metal layers provides mechanical stability. In many applications, large displays having polymeric substrates may be desired. These substrates are often flexible, leading to inadvertent bending, twisting, or distorting during processing. Such stress may cause TCO electrodes or single auxiliary metal strips to crack. However, the metal layer having a periodic array of holes provides multiple conductive paths, thus decreasing the possibility of failure of an electrode due to cracking and loss of electrical conductivity.

Examples of different hole shapes and array configurations that may be used in the metal layers are shown in FIGS. 4(a)–(e). The percentage of light transmitted through these configurations is determined by the areal density of holes.

Figure 4A:
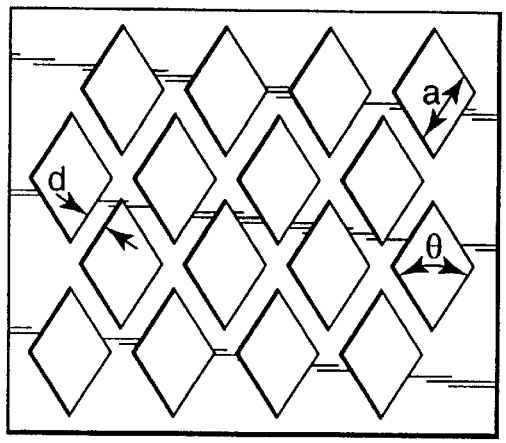
FIGS. 4(a)–(e) are schematic representations of various metal coating patterns that may be employed in the present invention.

An array of diamond shaped holes is shown in FIG. 4(a). The pattern is defined by holes have four sides of equal distance a, a perpendicular distance d separating the holes, and the angle θ. The transmission percentage T of this configuration is:

$$T = \frac{a^2 \sin^2 \theta}{(a \sin \theta + d)^2}.$$

Thus, T approaches 100% as d gets smaller.

Figure 4B:
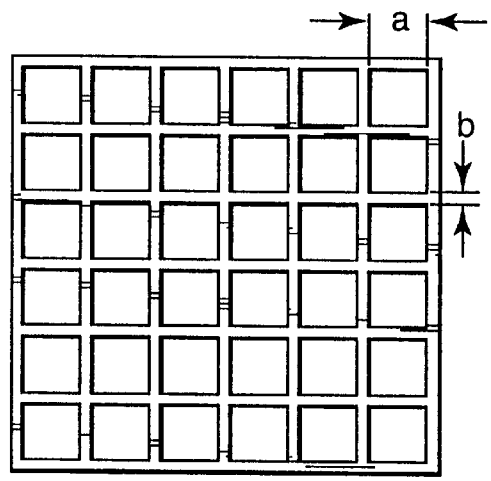

A square array of square holes is shown in FIG. 4(b). Each square hole has sides of length a, and the distance between the holes is b. Thus, the transmission of this pattern is given by:

$$T = \frac{a^2}{(a+b)^2}.$$

Again, as b is made smaller, the transmission of this pattern approaches 100%.

Figure 4C:
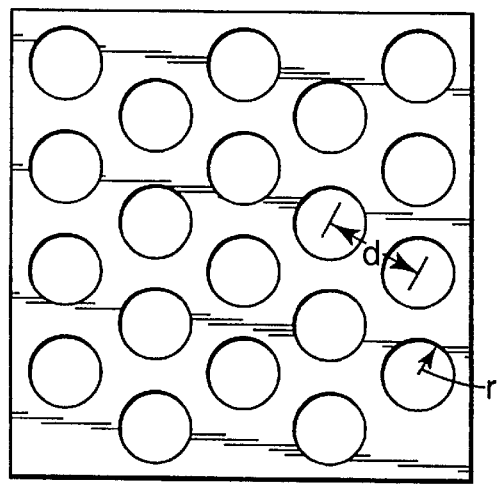

In FIG. 4(c) a hexagonal array of circular holes is shown. The radius of each circular hole is r and the center-to-center distance between circular holes is d. This pattern has a transmission of:

$$T = \frac{\pi r^2}{(\sqrt{3}/2)d^2}.$$

The maximum transmission of this pattern is 90.7%, namely when d=2r.

Figure 4D:
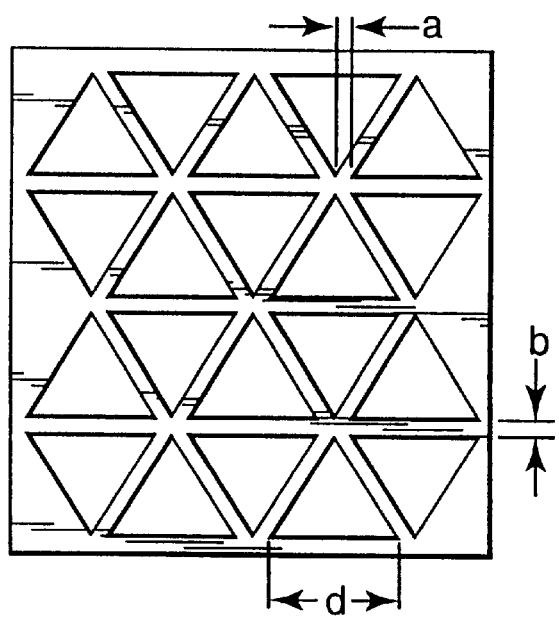

A regular array of equilateral triangular hole pairs is shown in FIG. 4(d). The distance a is the distance between adjacent triangle apexes, the distance b is the distance between adjacent triangle bases, and d is the length of a side of a triangular hole. The transmission of this pattern is:

$$T = \frac{\sqrt{3}\, d^2}{(d+2a)(\sqrt{3}\, d + 2b)}.$$

Thus, reduction of either or both of a or b results in higher transmission.

Figure 4E:
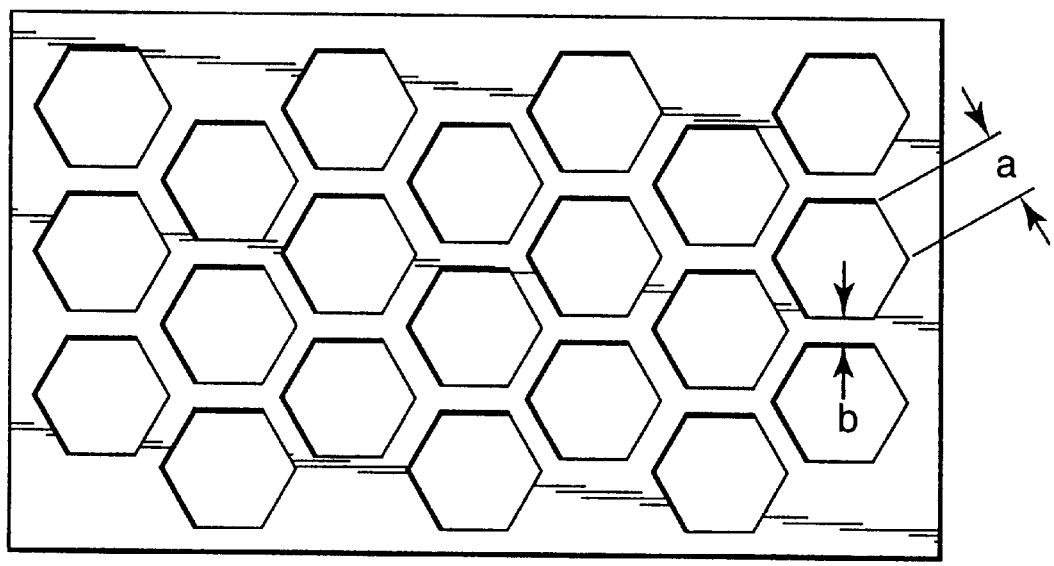

Finally, a hexagonal array of hexagonal holes is shown in FIG. 4(e). The length of each side of a hexagonal hole is a, and the distance between holes is b. The transmission of this patter is given by:

$$T = \frac{3a^2}{\left(\sqrt{3}\,a+b\right)^2}.$$

When b is decreased, T approaches 100%.

EXAMPLE C1

A diamond grid mask was used as shown in FIG. 4(a) with a=51 μm, d=10 μm, and θ=45°. The transmission, or aperture ratio, of this mask was 61%. To make a patterned metal coating, first copper was evaporated onto a PET substrate to a thickness of 100 nm (0.1 μm). The sheet resistance of the copper coating was measured to be 0.74 Ω/square. The copper surface was then spin coated with Shipley photoresist 818 at 2000 rpm for 40 seconds and dried at 105° C. for 30 minutes. The photoresist was then exposed through the diamond grid mask to ultraviolet light at a wavelength of 365 nm and an intensity of 12.9 mW/cm² for 15 seconds. The activated areas of the photoresist were rinsed away to expose diamond-shaped portions of the copper surface. The exposed copper was etched with a diluted solution of $FeCl_3$ to make the diamond-shaped holes. Due to over-etching, the width of the copper pattern, d, was approximately 5 μm in this example rather than the ideal 10 μm. The photoresist was then removed and the sample was coated with ITO. The resultant sheet resistance was measured to be 25 Ω/square, and the optical transmission was measured to be 70% in the visible spectrum, including two surface reflection losses, whereas the aperture ratio of the pattern was 78%.

EXAMPLE C2

The same procedure was followed as in Example C1, except that the copper coating thickness was 200 nm (0.2 μm) and the over-etching was minimized. The resulting sheet resistance was 4.3 Ω/square, and the optical transmission was 65%.

EXAMPLE C3

The same procedure was followed as in Example C1, except that the mask used had the following dimensions: a=190 μm, d=10 μm, and θ=45°. Also, the metal used was aluminum and was coated to a thickness of 100 nm (0.1 μm). The resulting sheet resistance after patterning and ITO coating was 10 Ω/square with an optical transmission of 78%.

What is claimed is:

1. An electronic display device comprising a substrate element that is substantially transparent to visible light, the substrate element comprising a transparent base layer, a plurality of independently addressable transparent electrodes disposed on the base layer, and a contiguous metallic coating associated with each transparent conductive electrode to increase the conductivity of the associated transparent conductive electrode, wherein the contiguous metallic coating comprises a periodic array of holes arranged to allow a significant amount of visible light to be transmitted through the substrate element.

2. The substrate element of claim 1, wherein the transparent conductive electrodes comprise a transparent conductive oxide.

3. The substrate element of claim 2, wherein the transparent conductive oxide is indium tin oxide.

4. The substrate element of claim 1, wherein the metallic coating comprises Cr, Cu, Ag, Au, Ni, W, Al, Pt, Ti, Fe, Sn, or combinations and alloys thereof.

5. The substrate element of claim 1, wherein the periodic array of holes is selected from the group consisting of:

(a) a two-dimensional array of diamond-shaped holes,
   (b) a hexagonal array of circular holes,
   (c) a square array of square holes,
   (d) a two-dimensional array of triangular hole pairs, and
   (e) a hexagonal array of hexagonal holes, and combinations thereof.

* * * * *

UNITED STATES PATENT AND TRADEMARK OFFICE
CERTIFICATE OF CORRECTION

PATENT NO. : 6,198,051 B1
DATED : March 6, 2001
INVENTOR(S) : Moshrefzadeh, Robert S.

It is certified that error appears in the above-identified patent and that said Letters Patent is hereby corrected as shown below:

Column 4,
Line 61, delete "layers are preferably" and insert in place thereof -- layers preferably --.

Column 7,
Line 7, delete "comer" and insert in place thereof -- corner --.

Column 15,
Line 15, delete "comers" and insert in place thereof -- corners --.

Column 8,
Line 7, delete "used" and insert in place thereof -- use --.

Column 10,
Line 6, delete "electrodes" and insert in place thereof -- electrode --.
Line 24, delete "have" and insert in place thereof -- having --.

Signed and Sealed this

Twenty-eighth Day of January, 2003

JAMES E. ROGAN
*Director of the United States Patent and Trademark Office*